United States Patent [19]
Fan et al.

[11] Patent Number: 5,002,854
[45] Date of Patent: Mar. 26, 1991

[54] SOLID IMAGING METHOD USING COMPOSITIONS CONTAINING CORE-SHELL POLYMERS

[75] Inventors: Roxy N. Fan, E. Brunswick; Michael Fryd, Moorestown, both of N.J.

[73] Assignee: E. I. Du Pont de Nemours and Company, Wilmington, Del.

[21] Appl. No.: 341,347

[22] Filed: Apr. 21, 1989

[51] Int. Cl.$^5$ ............................................. G03C 1/492
[52] U.S. Cl. .................................... 430/270; 430/269; 430/945; 425/162; 425/174; 425/174.4; 264/22; 522/2
[58] Field of Search ...................... 430/269, 270, 945; 425/162, 174, 174.4; 522/2; 264/22

[56] References Cited

U.S. PATENT DOCUMENTS

| 4,137,081 | 1/1979 | Pohl | 430/286 |
| 4,414,278 | 11/1983 | Cohn et al. | 428/402 |
| 4,575,330 | 3/1986 | Hull | 425/11 |
| 4,698,373 | 10/1987 | Tateosian et al. | 522/95 |
| 4,726,877 | 2/1988 | Fryd et al. | 156/630 |
| 4,752,498 | 6/1988 | Fudim | 427/54.1 |
| 4,753,865 | 6/1988 | Fryd et al. | 430/281 |

FOREIGN PATENT DOCUMENTS 0250121 6/1987 European Pat. Off.
52-116301 9/1977 Japan.

OTHER PUBLICATIONS

Kodama, Hideo, Rev. Sci. Instrum. 52(11), 1770–1773, Nov. 1981.
Herbert, Allan J.; Journal of Applied Photographic Engineering, 8(4), 185–188, Aug. 1982.

Primary Examiner—Jack P. Brammer

[57] ABSTRACT

A three-dimensional object formed from a photohardenable composition containing deflecting matter of core-shell polymers. A preferred material for the polymeric core is crosslinked to an extent to be nonswellable and insoluble in solvent for noncrosslinked polymer material while the shell polymer has no pendant acid groups.

14 Claims, 3 Drawing Sheets

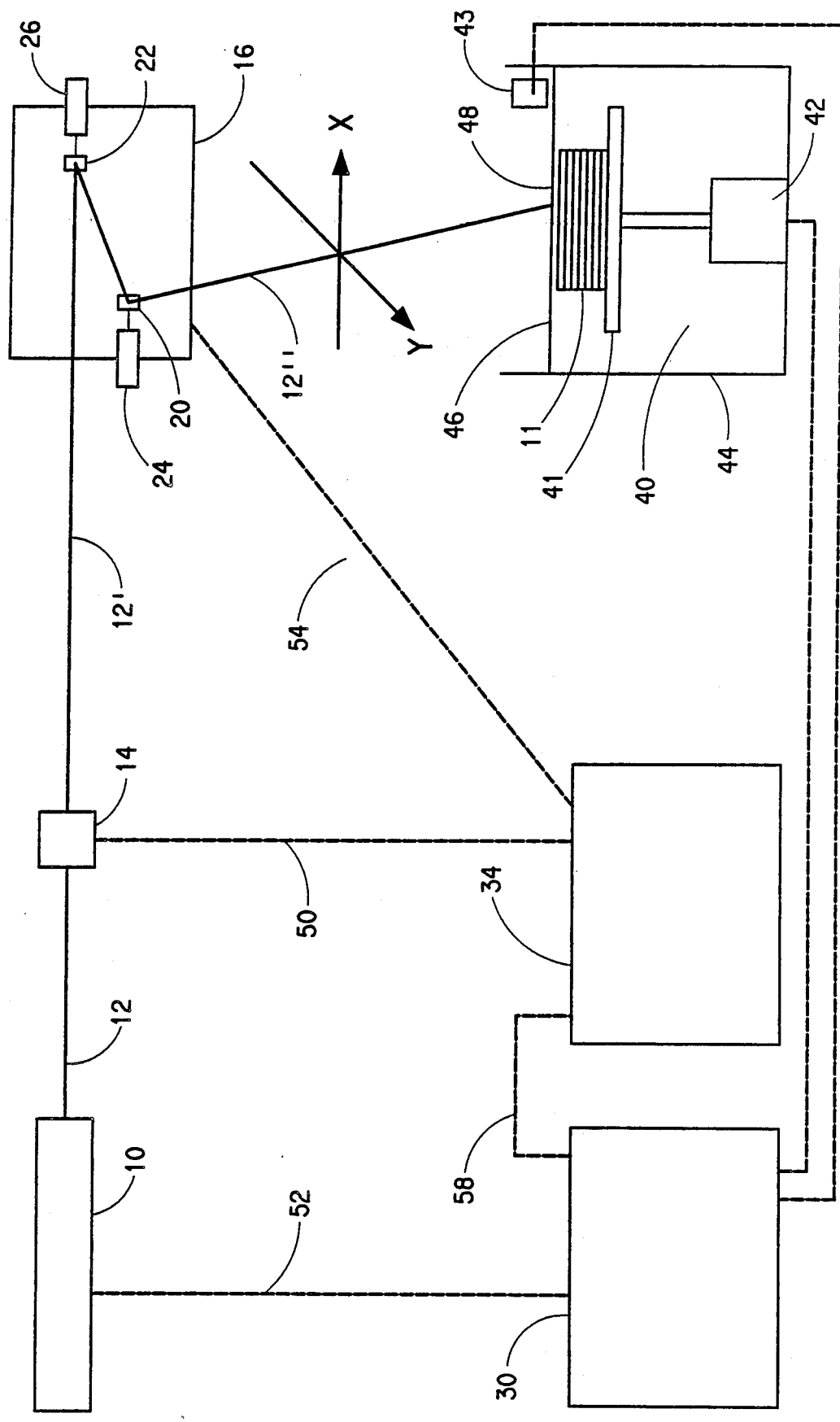

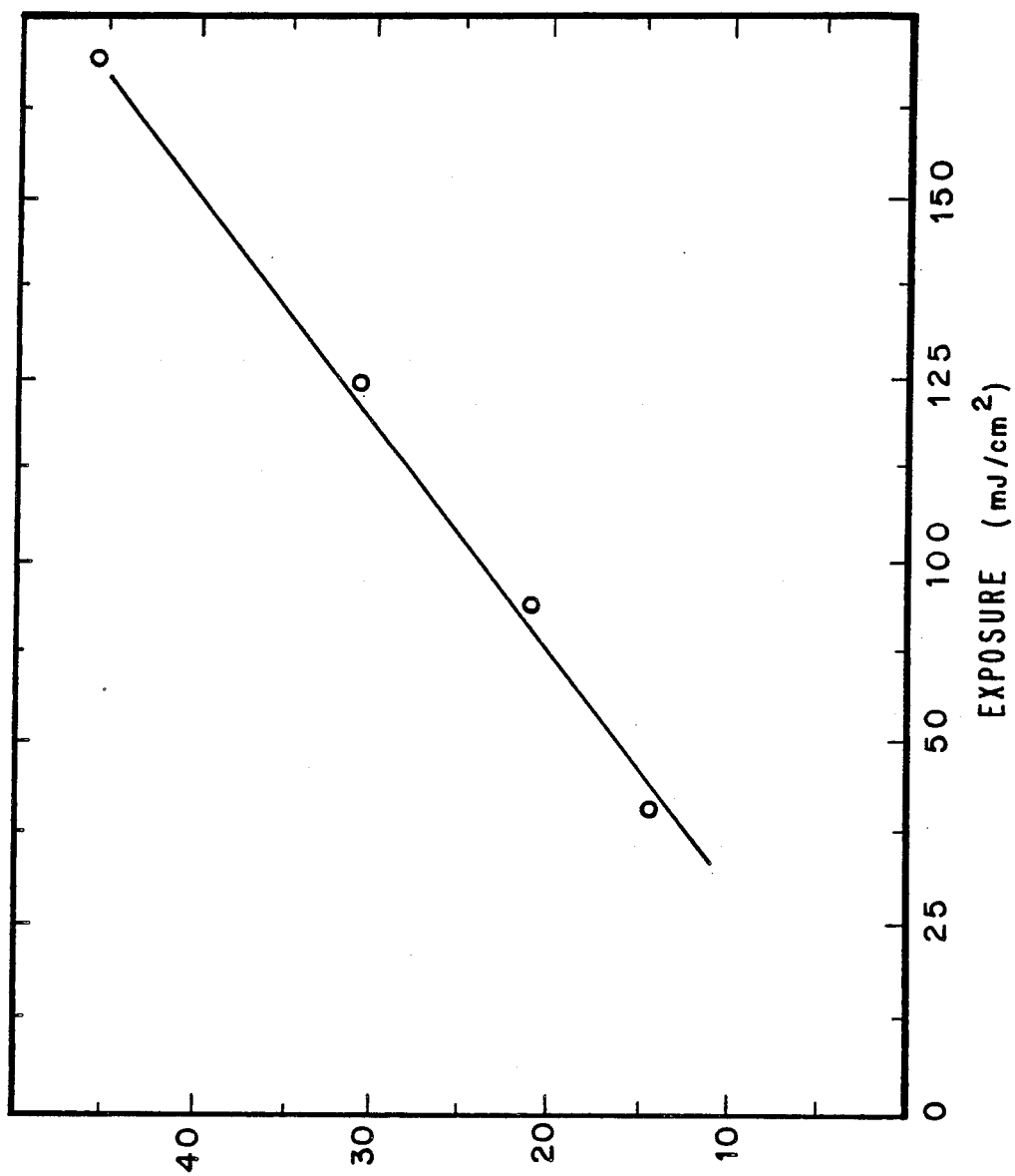

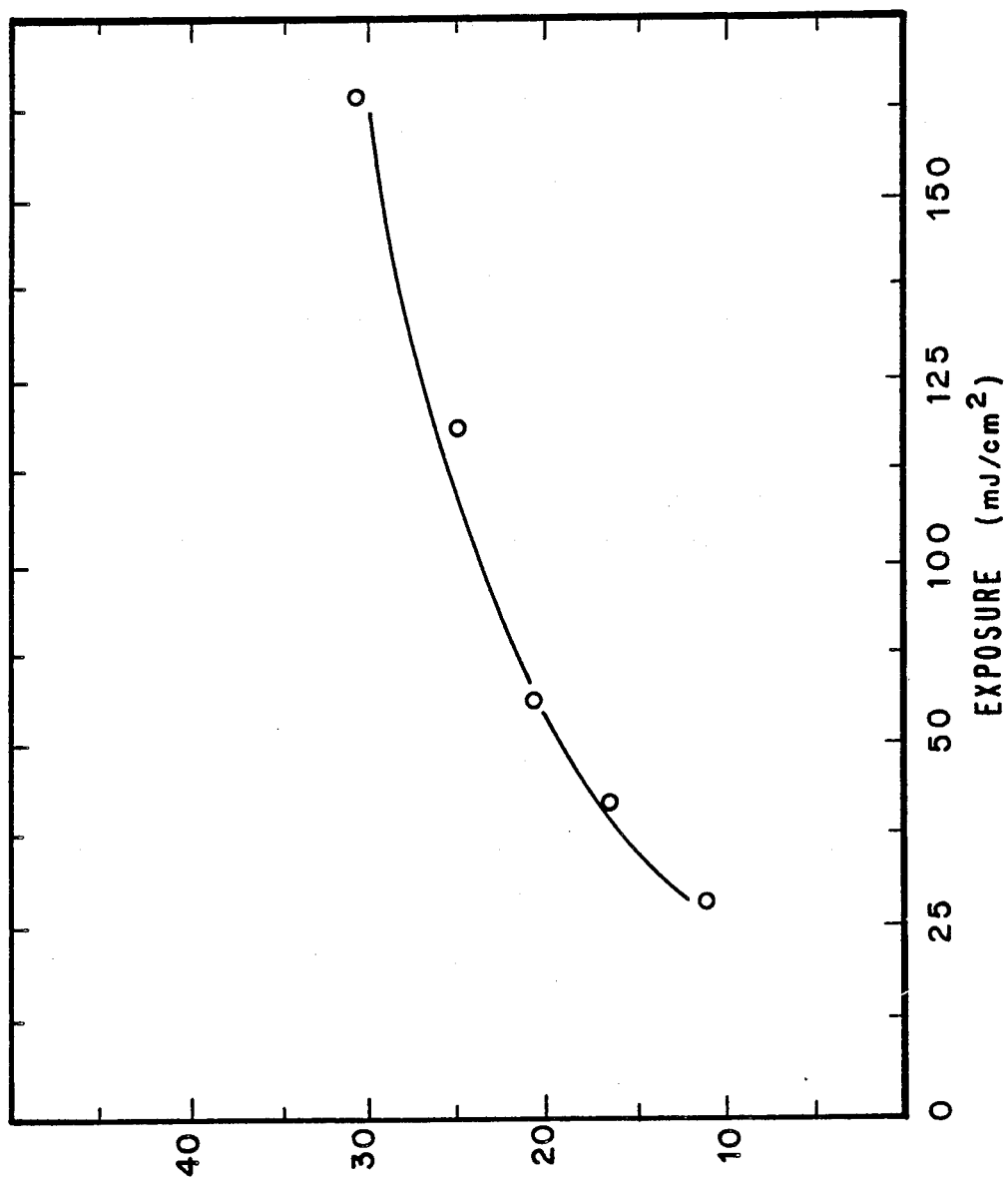

SOLID IMAGING METHOD USING COMPOSITIONS CONTAINING CORE-SHELL POLYMERS

FIELD OF THE INVENTION

This invention relates to production of three-dimensional objects by photohardening, and more particularly to a method utilizing photohardenable compositions containing core or core-shell polymers and characterized by good shelf stability and by self limiting the depth of photohardening during irradiation.

BACKGROUND OF THE INVENTION

Many systems for production of three-dimensional modeling by photohardening have been proposed. European Patent Application No. 250,121 filed by Scitex Corp. Ltd. on June 6, 1987, provides a good summary of documents pertinent to this art area, including various approaches attributed to Hull, Kodama, and Herbert. Additional background is described in U.S. Pat. No. 4,752,498 issued to Fudim on June 21, 1988.

These approaches relate to the formation of solid sectors of three-dimensional objects in steps by sequential irradiation of areas or volumes sought to be solidified. Various masking techniques are described as well as the use of direct laser writing, i.e., exposing a photohardenable polymer with a laser beam according to a desired pattern and building a three-dimensional model layer by layer.

However, all these approaches fail to identify practical ways of utilizing the advantages of vector scanning combined with means to maintain constant exposure and attain substantially constant final thickness of all hardened portions on each layer throughout the body of the rigid three-dimensional object. Furthermore, they fail to recognize very important interrelations within specific ranges of operation, which govern the process and the apparatus parameters in order to render them practical and useful. Such ranges are those of constant exposure levels dependent on the photohardening response of the material, those of minimum distance traveled by the beam at maximum acceleration dependent on the resolution and depth of photohardening, as well as those of maximum beam intensity depend on the photospeed of the photohardenable composition.

The Scitex patent, for example, suggests the use of photomasks or raster scanning for achieving uniform exposure, but does not suggest a solution for keeping the exposure constant in the case of vector scanning. The use of photomasks renders such techniques excessively time consuming and expensive. Raster scanning is also undesirable compared to vector scanning for a number of reasons, including:

necessity to scan the whole field even if the object to be produced is only a very small part of the total volume, considerably increased amount of data to be stored in most cases, overall more difficult manipulation of the stored data, and the necessity to convert CAD-based vector data to raster data.

On the other hand, in the case of vector scanning only the areas corresponding to the shape of the rigid object have to be scanned, the amount of data to be stored is smaller the data can be manipulated more easily, and "more than 90% of the CAD based machines generate and utilize vector data" (Lasers & Optronics, Jan. 1989, Vol. 8, No. 1, pg. 56). The main reason why laser vector scanning has not been utilized extensively so far is the fact that, despite its advantages, it introduces problems related to the inertia of the optical members, such as mirrors, of the available deflection systems for the currently most convenient actinic radiation sources, such as lasers. Since these systems are electromechanical in nature, there is a finite acceleration involved in reaching any beam velocity. This unavoidable non-uniformity in velocity results in unacceptable thickness variations. Especially in the case of portions of layers having no immediate previous levels of exposure at the high intensity it becomes necessary to use high beam velocities, and therefore, longer acceleration times, which in turn result in thickness non-uniformity. The use of low intensity lasers does not provide a good solution since it makes production of a solid object excessively time consuming. In addition, the usefulness of vector scanning is further minimized unless at least the aforementioned depth and exposure level relationships are observed as evidenced under the Detailed Description of this invention.

No special attention has been paid so far to the composition itself by related art in the field of solid imaging, except in very general terms.

Thus, the compositions usually employed, present a number of different problems, major ones of which is excessive photohardening depthwise usually accompanied by inadequate photohardening widthwise and non-uniformity in thickness. These problems become especially severe in cantilevered or other areas of the rigid object, which areas are not immediately over a substrate. Another major problem has to do with shelf stability of the photohardenable composition, due to settling.

Therefore, it is an object of this invention to resolve the problems cited above by incorporating appropriate core or core-shell radiation deflecting matter in the photohardenable composition in order to limit the depth of photohardening with simultaneous increase of the width of photohardening, so that the resolution is better balanced in all directions, and at the same time the shelf stability improves considerably. The term "core-shell polymers" as discussed hereinafter is taken under its most broadest meaning, which also includes polymers consisting essentially of a core without a shell.

European Patent Application 250,121 (Scitex Corp., Ltd.) discloses a three-dimensional modelling apparatus using a solidifiable liquid which includes radiation transparent particles in order to reduce shrinkage.

U.S. Pat. No. 4,753,865 (Fryd et al.) describes solid photopolymerizable compositions containing addition polymerizable ethylenically unsaturated monomer, initiating system polymer, binder and microgel, wherein preferably the binder and microgel form substantially a single phase.

SUMMARY OF THE INVENTION

The instant invention is directed to methods for direct production of three-dimensional photohardened solid objects, layer by layer using actinic radiation, preferably in a beam form such as provided by lasers for direct writing, by utilizing photohardenable compositions, which contain core-shell polymers as radiation deflection matter in order to limit the depth of photohardening with simultaneous increase of the width of photohardening, so that the resolution is better balanced in all directions. The integrity of the integral three-dimensional objects or parts thus formed is also highly improved. By selecting the monomers involved in the polymeric structure, as well as the core to shell ratio, outstanding shelf stability is achieved.

This invention may be summarized as follows:

A method for accurately fabricating an integral three-dimensional object from successive layers of a photohardenable liquid composition comprising the steps of:

(a) forming a layer of a photohardenable liquid;

(b) photohardening at least a portion of the layer of photohardenable liquid by exposure to actinic radiation;

(c) introducing a new layer of photohardenable liquid onto the layer previously exposed to actinic radiation; and (d) photohardening at least a portion of the new liquid layer by exposure to actinic radiation, with the requirement that the photohardenable composition comprises an ethylenically unsaturated monomer, a photoinitiator, and radiation deflecting matter, the deflecting matter being coreshell polymers having a core to shell ratio and a first index of refraction, and the rest of the composition having a second index of refraction, the absolute value of the difference between the first index of refraction and the second index of refraction being different than zero;

wherein the core to shell weight ratio is preferably 2:1 or greater.

Preferably the composition also contains a plasticizer, and even more preferably the plasticizer is inert.

BRIEF DESCRIPTION OF THE DRAWING

The reader's understanding of practical implementation of preferred embodiments of the invention will be enhanced by reference to the following detailed description taken in conjunction with perusal of the drawing figure, wherein:

FIG. 1 is a block diagram of an apparatus used to perform the preferred embodiment of the process of the instant invention.

FIG. 2 shows a typical relationship between depth of photohardening and exposure in the case of a clear photohardenable composition.

FIG. 3 shows a typical relationship between depth of photohardening and exposure in the case of a photohardenable composition containing a core shell polymer having a core to shell ratio within the preferred range.

DETAILED DESCRIPTION OF THE INVENTION

The instant invention is directed to methods for direct production of three-dimensional photohardened solid objects, layer by layer using actinic radiation, preferably in a beam form such as provided by lasers for direct writing, by using photohardenable compositions comprising an ethylenically unsaturated compositions comprising an ethylenically unsaturated monomer, a photoinitiator, and radiation deflecting matter, the deflecting matter having a first index of refraction, and the rest of the composition having a second index of refraction, the absolute value of the difference between the first index of refraction and the second index of refraction being different than zero. Preferably, the composition contains also a plasticizer.

As aforementioned, many systems for production of three-dimensional modeling by photohardening have been proposed. European Patent Application No. 250,121 filed by Scitex Corp. Ltd. on June 6, 1987, provides a good summary of documents pertinent to this art area, including various approaches attributed to Hull, Kodama, and Herbert. Additional background is described in U.S. Pat. No. 4,752,498 issued to Fudim on June 21, 1988.

In a preferred embodiment, an apparatus for practicing the present invention is depicted in FIG. 1, in the form of a block diagram. The apparatus and its operation are described below.

Actinic radiation means 10 shown in FIG. 1, which is preferably a high power laser, is used to provide an actinic radiation beam 12 having a certain intensity. The radiation beam 12 is passed through a modulator 14, where its intensity may be modulated. The modulated beam 12' is passed in turn through deflection means 16 such as a vector scanner in the form of a two-mirror 20 and 22 assembly, each mirror separately driven by a different motor 24 and 26 respectively. By causing mirror 20 driven by motor 24 to turn, the beam is deflected in an X direction, while by causing mirror 22 to turn, the beam is deflected in a Y direction, X direction being perpendicular to the Y direction. The actinic radiation beam 12" is thus controllably deflected towards preselected portions of the photohardenable composition which is contained in vessel 44 and presents a surface 46. It photohardens a thin layer 48 closest to the surface 46 of a photohardenable composition 40, to a depth of photohardening which equals the maximum thickness of the layer 48. The composite movement of the beam is preferably a vector type movement, and the beam is said to move or be scanned in a vector mode. Due to the inertia of the electromechanical deflection means 16, the velocity of the beam 12" on the thin layer 48 is also limited by the inertia and the electromechanical nature of the deflection means 16.

The deflection of the two mirrors 20 and 22 through motors 24 and 26 respectively is controlled by the second computer control means 34, while the graphic data corresponding to the shape of the solid object under production are stored in the first computer control means 30.

The second computer control means 34 is coupled with the modulation means 14, the deflection means 16, and the first computer control means 30, through control/feedback lines 50, 54, and 58, respectively. The graphic data stored in computer control means 30 are fed to computer control means 34, and after being processed cause motors 24 and 26 to turn and move mirrors 20 and 22 accordingly in order to deflect the beam towards predetermined positions on the thin layer 48. Electrical feedback regarding the relative movements of the mirrors 20 and 22 is provided by the deflection means to the second computer control means 34 through line 54.

The manner of introducing successive layers of photohardenable liquid and exposing to actinic radiation such as a laser will generally be by two methods. In a first method a pool of liquid is present in a vessel and it is not necessary to introduce additional photohardenable liquid. In such case a movable table or floor supports the liquid. Initially the table or floor is elevated with a portion of the photohardenable liquid present above the table or floor and a portion of the liquid present in the vessel around the edge of the table or floor and/or underneath it. (Illustratively a table is present which allows liquid to flow underneath the table as it is used.) After exposure and photohardening of a portion of the liquid layer above the table, the table is lowered to allow another layer of photohardenable liquid to flow on top of the previous layer followed by exposure of predetermined area on the newly applied liquid layer. If necessary due to the shape of the final three-dimensional article the thickness of more than one liquid layer can be photohardened. This procedure of table or floor lowering and exposure continues until formation of the desired three-dimensional article occurs.

In a second method a movable table or floor need not be employed but rather a new quantity of photohardenable liquid is introduced into a vessel after an exposure step in formation of a new liquid layer on a previously exposed layer containing both photohardened liquid photohardenable material. Criticality is not present in the manner of liquid introduction but rather in an ability to photoharden successive liquid layers.

In FIG. 1, a movable table 41 is initially positioned within the photohardenable composition 40, a short predetermined distance from the surface 46, providing a thin layer 48 between the surface 46 and the table 41. The positioning of the table is provided by the placement means 42, which in turn is controlled by the first computer control means 30 according to the data stored therein. The graphic data corresponding to the first layer of the shape of the rigid object are fed from computer control means 30 to computer control means 34, where they are processed along with feedback data obtained from deflecting means 16, and are fed to modulator 14 for controlling the same, so that when the beam travels in a vector mode on predetermined portions of the thin layer 48, the exposure remains constant.

When the first layer of the rigid object is complete, the movable table 41 is lowered by a small predetermined distance by the placement means 42 through a command from first computer control means 30. Following a similar command from computer means 30, layer forming means, such as doctor knife 43 sweeps the surface 46 for leveling purposes. The same procedure is then followed for producing the second, third, and the following layers until the rigid object is completed.

In the discussions above and below, the actinic radiation, preferably in the form of a beam, and more preferably in the form of a laser beam, is many times referred to as light, or it is given other connotations. This is done to make the discussion clearer in view of the particular example being described. Thus, it should not be taken as restricting the scope and limits of this invention. Nevertheless, the preferred actinic radiation is light, including ultraviolet (UV), visible, and infrared (IR) light. From these three wavelength regions of light, ultraviolet is even more preferred. The formulation of the photohardenable compositions for solid imaging purposes is very important in order to receive the desirable effects and characteristics, regardless of whether the scanning is of the vector type, raster type, or any other type, and the discussion hereinafter is referred to in any type of scanning, unless otherwise stated. However, from the different types of scanning, the vector type is the preferred type of scanning.

A photohardenable composition for solid imaging should contain at least one photohardenable monomer or oligomer and at least one photoinitiator. For the purposes of this invention, the words monomer and oligomer have substantially the same meaning and they may be used interchangeably.

Examples of suitable monomers which can be used alone or in combination with other monomers include t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di(p-hydroxyphenyl)propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable-ethylenic linkages particularly when present as terminal linkages. Particularly preferred monomers are ethoxylated trimethylolpropane triacrylate, ethylated pentaerythritol triacrylate, dipentaerythritol monohydroxypentaacrylate 1,10-decanediol dimethylacrylate, di-(3-acryloxy-2-hydroxypropyl) ether of bisphenol A oligomers, di-(3-methacryloxy-2-hydroxyl alkyl) ether of bisphenol A oligomers, urethane diacrylates and methacrylates and oligomers thereof, coprolactone acrylates and methacrylates, propoxylated neopentyl glycol diacrylate and methacrylate, and mixtures thereof.

Examples of photoinitiators which are useful in the present invention alone or in combination are described in U.S. Pat. No. 2,760,863 and include vicinal ketaldonyl alcohols such as benzoin, pivaloin, acyloin ethers, e.g., benzoin methyl and ethyl ethers, benzil dimethyl ketal; α-hydrocarbon-substituted aromatic acyloins, including α-methylbenzoin α-allylbenzoin, α-phenylbenzoin, 1-hydroxylcyclohexyl phenol ketone, diethoxyphenol acetophenone, 2-methyl-1-[4-(methylthio)-phenyl]-2-morpholino-propanone-1. Photoreducible dyes and reducing agents disclosed in U.S. Pat. Nos. 2,850,445, 2,875,047, 3,097,096, 3,074,974, 3,097,097 and 3,145,104, as well as dyes of the phenazine, oxazine, and quinone classes, Michler's ketone, benzophenone, acryloxy benzophenone, 2,4,5-triphenylimidazolyl dimers with hydrogen donors including leuco dyes and mixtures thereof as described in U.S. Pat. Nos. 3,427,161, 3,479,185 and 3,549,367 can be used as initiators. Also useful with photoinitiators and photoinhibitors are sensitizers disclosed in U.S. Pat No. 4,162,162. The photoinitiator or photoinitiator system is present in 0.05 to 10% by weight based on the total weight of the photohardenable composition. Other suitable photoinitiation systems which are thermally inactive but which generate free radicals upon exposure to actinic light at or below 185° C. include the substituted or unsubstituted polynuclear quinones which are compounds having two intracyclic carbon atoms in a conjugated carbocyclic ring system, e.g., 9,10-anthraquinone, 2-methylanthraquinone, 2-ethylanthraquinone, 2-tert-butylanthraquinone, octamethylanthraquinone, 1,4-naphthoquinone, 9,10-phenanthraquinone, benz(a)anthracene-7,12-dione, 2,3-naphthacene-5,12-dione, 2-methyl-1,4-naphthoquinone, 1,4-dimethyl-anthraquinone, 2,3-dimethylanthraquinone, 2-phenylanthraquinone, 2,3-diphenylanthraquinone, retenequinone, 7,8,9,10-tetrahydronaphthacene-5,12-dione, and 1,2,3,4-tetrahydrobenz(a)anthracene-7,12-dione; also, alpha amino aromatic ketones, halogenated compounds like Trichloromethyl substituted cyclohexadienones and triazines or chlorinated acetophenone derivatives, thioxanthones in presence of tertiary amines, and titanocenes.

Although the preferred mechanism of photohardening is free radical polymerization, other mechanisms of photohardening apply also within the realm of this invention. Such other mechanisms include but are not limited to cationic polymerization, anionic polymerization, condensation polymerization, addition polymerization, and the like.

Other components may also be present in the photohardenable compositions, e.g., pigments, dyes, extenders, thermal inhibitors, interlayer and generally interfacial adhesion promoters, such as organosilane coupling agents, dispersants, surfactants, plasticizers, coating aids such as polyethylene oxides, etc. so long as the photohardenable compositions retain their essential properties.

In this discussion a clear distinction should be made between a photohardenable and a photohardened composition. The former refers to one which has not yet been subjected to irradiation, while the latter The instant invention is intended for solid imaging techniques which use photohardenable compositions comprising an ethylenically unsaturated monomer, a photoinitiator, and core or core-shell polymer as radiation deflecting matter, the deflecting matter having a first index of refraction, and the rest of the composition having a second index of refraction, the absolute value of the difference between the first index of refraction and the second index of refraction being different than zero, and wherein the core to shell ratio is within the region of 2:1 or greater and more preferably of 2:1 to 7:1 and the region covering ratios greater than 9:1. The latter region includes polymers containing no shell.

When the composition is clear to the radiation beam, the depth of photohardening is considerably larger than the width of photohardening, mainly because the beams utilized, such as laser beams, and the like, are well collimated and focused. Addition of inert particulate matter, which is transparent to the radiation in the environment of the composition, has certain well recognized advantages, such as reduction of shrinkage upon polymerization or photohardening in general, and often increase in photospeed due to the reduction of the amount of active composition, which is subject to shrinkage, per unit of volume.

The large depth of photohardening is not a very big problem in areas supported by a substrate, since the depth is determined primarily by the thickness of the liquid layer on top of the substrate. However, in cantilevered unsupported areas, where the thickness of the liquid is very large, it becomes a serious disadvantage, as the depth of photohardening is not controlled or limited any more by the substrate. This disadvantage, as the depth of photohardening is not controlled or limited any more by the substrate. This is actually the area where the differences between conventional two dimensional imaging and solid or three-dimensional imaging manifest themselves as being most profound. This is particularly important when there are uncontrollable exposure variations, which may result in thickness variations, and poor resolution. Thus a way to control the thickness is needed.

In addition to the lack of control of the depth of photohardening, there is one more problem having to do with resolution considerations. Except in very limited occasions, it is highly desirable for the resolution or tolerances of a part to be comparable in all dimensions. It does not make much sense to have high resolution in one dimension and very poor resolution in another dimension since the final resolution is going to be necessarily considered as poor, except in rare occasions as mentioned above. In clear compositions, the depth to width ratio is high, and thus the resolution widthwise is accordingly higher than the resolution depthwise. As a matter of fact, the resolution is inversely proportional to the dimensional units, and therefore, if the depth to width ratio is for example 5, the width resolution will be five times better than the depth resolution, when other factors do not play an active role. Thus, high transparency of the composition becomes in general undesirable. Preferable regions of depth to width ratios are 7:1 to 1:1, and more preferable 3:1 to 1:1.

The task of reducing the transparency or in other words increasing the optical density, also referred to as opacity, of the photohardenable composition sounds as a rather straightforward one, and it is, if photospeed and other important parameters are not taken into account. For example, addition of a radiation absorbent in the composition will decrease the depth of photohardening without affecting considerably the width. Typical absorbents are dyes, or the photoinitiator itself. The monomers or oligomers of the composition may also act as absorbants to different degrees. However, if a dye, or other absorbent is used, the part of the radiation which is absorbed by it will not be available to directly promote photohardening.

Considering now the photoinitiator as means of absorption to reduce the depth of photohardening, it should be realized that in order for this to happen a certain high content in photoinitiator has to be exceeded. As the content in photoinitiator in the composition increases from zero incrementally, the photospeed increases but at the same time the depth also increases since low starving areas at the bottom of the depth of photohardening form now more polymer due to the increase in number of free radicals. Only when the radiation starts being intercepted to a considerable degree by an excessive amount of photoinitiator, will the depth of photohardening start decreasing. However, the properties of the photohardened object will start deteriorating. This is because as the concentration of free radicals being formed increases the molecular weight decreases, and therefore the structural properties deteriorate. At the same time, in the plethora of free radicals, the free radicals may start combining with each other and just absorb energy without fulfilling their role of photoinitiation. Thus, although the amount of photoinitiator can in a limited way serve as mean for controlling the depth of photohardening, other undesirable phenomena occurring simultaneously, decrease considerably its usefulness when employed only by itself for this purpose.

According to this invention, a separate phase of core-shell polymer in the form of dispersed particulate solid matter may be utilized, preferably with emulsified liquid radiation deflecting matter, and/or plasticizers to control the depth/width relation, under certain conditions, which involve refraction or reflection or scattering of light or any combination thereof, labelled as radiation deflection for the purposes of this discussion. If everything else is kept constant, as the content in separate phase of radiation deflecting matter is increased, so does the width in expense of the depth. Since the radiation is not absorbed but just deflected, no considerable loss of radiation occurs, and therefore, there is no substantial loss of photospeed. Thus, the radiation deflective matter which may be utilized in the preferred embodiments of this invention is substantially non-transparent in the environment of the photohardenable composition, since it gives opacity to the same.

It is essential to note that the phenomena of transparency, and non-transparency (translucence, opacity, absorbance) are only important when examined in the environment and conditions within the limits of which they occur. A powder for example dispersed in a medium, is transparent to radiation if not only it does not absorb inherently the radiation, but also if it has substantially the same index of refraction as the medium so that no light deflection takes place at or around the interface of each particle of the powder and the medium. The same powder, when dispersed in a liquid of substantially different refraction index, it will appear as translucent or opaque (hindering at least part of the light to travel directly through the medium containing the powder); in other words it will appear as non-transparent. Thus, translucence and opacity may have similar end results as absorbance regarding amount of light passing through.

The amount of light-deflecting matter to give optimum properties to the photohardenable composition is a function of a number of factors, as shown below, as well as of the balance of gains and compromises that constitute what is considered to be "optimum" at the time, depending on the particular circumstances. Thus, it would not be appropriate to attempt to give absolute numbers in order to show how one can achieve optimum properties. It would rather be much more accurate to show the interrelationships governing these factors, in order to allow a person skilled in the art to practice this invention and select a set of properties that he or she would consider optimum for the desired result. It is preferable that there is an adequate amount of radiation deflecting matter in the composition to reduce the depth of photohardening by at least 10%, more preferably at least by 20%, and even more preferably at least by 40%. It is also preferable that the depth to width ratio does not increase by such addition. In any case, the amount of light deflecting matter may be from 5% to 70% by weight, depending on the degree of deflection that it may provide. In less extreme cases with regard to both particle size and refraction index, it would be preferable for the amount of the deflecting matter in the composition to range within 10% and 60%, and most preferable within 20% and 50% by weight. As mentioned before, matter such as radiation deflecting matter is desirable also for reducing shrinkage and for increasing photospeed.

Initially, if we call "particle" each individual unit of the separate phase of the dispersed matter in the photohardenable composition as aforementioned, the maximum particle size, measured as the average particle diameter, should be smaller than the depth of photohardening, but not width necessarily. It is preferred that not only substantially all particles are smaller than the depth of photohardening, but also that at least 90% of the particles are smaller than half the depth of photohardening, and even more preferred that at least 90% of the particles are smaller than one tenth the depth of photohardening.

In order to be effective for their purpose, the majority of particles should also be preferably larger than approximately half the wavelength of the beam's radiation. At approximately half the wavelength, the scattering yield of the particles attains a maximum value, while it decreases rapidly as the size of the particles goes down. On the other hand, as the particle size increases over about half the wavelength of the radiation, the scattering yield also starts dropping, but at a lower pace. As the particle size increases even more, the phenomena of refraction and reflection start prevailing. In practice there are only limited situations where all particles have substantially the same size, in which case they are called monodisperse. Generally, there is a distribution of particle sizes providing a combination of all types of actinic-radiation deflection. Taking into account also that the higher the refractive index of the particle the higher the scattering, one can practically achieve any desired opacity, by lowering or raising the content in deflecting matter, which in turn will control the depth of photohardening.

The separate phase of the deflection matter should have a different refraction index than that of the rest of the photohardenable composition. The two refraction indices should preferably be differing by at least 0.01, more preferably by at least 0.02, and even more preferably by at least 0.04.

It is also preferable that the refraction index of the phase of the deflection matter is lower than that of the photohardenable composition, as long as it falls within the above limitations.

There are instances where the initially opaque composition may become less opaque or even substantially transparent after exposure. This condition is less desirable, and in order to be operable in terms of this invention, it will require considerably larger amounts of radiation deflecting matter.

Reduction of the depth of photohardening to a desired level takes place with:

increased difference between the refractive index of the composition containing no radiation deflecting matter and the deflecting matter itself;

increased content in radiation deflecting matter;

decreased particle size;

increased difference in refractive index due to the result of actinic radiation.

According to this invention, the separate phase of deflecting matter is a core-shell polymer in the form of dispersed particulate solid matter. Preferably such solid matter is partially swellable in the liquid photohardenable compositions and give stable translucent dispersions and self limiting characteristics of thickness upon exposure.

Preferred core-shell polymers have a core comprising:

a monofunctional ethylenically unsaturated monomer, constituting 5%–97% of the total core by weight;

a multifunctional ethylenically unsaturated monomer or oligomer constituting 2%–70%, preferably 4%–70%, and even more preferably 4%–6% of the total core by weight; and an ethylenically unsaturated monomer with a grafting site constituting 1%–25%, preferably 5%–25%, and even more preferably 15%–25% of the total core by weight.

Preferred shells of core-shell polymers having also a shell, comprise a monofunctional ethylenically unsaturated monomer.

Preferred monofunctional ethylenically unsaturated monomers are those of the acrylate and methacrylate families, such as methyl, ethyl, propyl, butyl, and 2-ethyl-hexyl acrylates and methacrylates, styrene acrylonitrile, and methacrylonitrile. The most preferred multifunctional ethylenically unsaturated monomer is butane diole diacrylate, as ingredients of the photohardenable composition, may also be utilized. The most preferred ethylenically unsaturated monomer with a grafting site is allyl methacrylate. Other such monomers are those having grafting sides, such as glycidyl, hydroxyl, carboxyl, sulfonic acid, amine, isocyanate, and the like. In the latest case, where the grafting site is other than ethylenical unsaturation, the monomer used to produce the shell has to have a correspondingly reactive site in order to provide grafting. The final bond of grafting may be ionic or covalent.

The number average molecular weight of the polymer chains constituting the shell is preferably 5,000 to 200,000, more preferably 5,000 to 50,000, and even more preferably 1,000 to 5,000.

The core to shell weight ratio should preferably be 2:1 to 7:1 or greater than 9:1, more preferably 3:1 to 6:1, and most preferably over 10:1.

Photohardenable compositions containing core-shell polymers with core to shell ratios in a most preferred range of 2:1 to 7:1 or greater than 9:1 have excellent shelf stability properties, while the compositions containing polymers having ratios in the region of 7:1 to 9:1 do not exhibit so good shelf stability. This is unexpected and no explanation can be provided. However it is within the scope of the present invention that a core shell weight ratio is at least 2±1 or greater.

Since the core-shell polymers are swellable and tend to raise the viscosity, it is preferable to add an inert liquid component in the photohardenable composition along with the core-shell polymers.

This addition also helps in reducing the amount of shrinkage occurring during photohardening.

The plasticizers can be liquid or solid as well as polymeric in nature.

Examples of diethyl phthalate, dibutyl phthalate, butyl benzyl phthalate, dibenzyl phthalate, alkyl phosphates, polyalkylene glycols, glycerol, poly(ethylene oxides), hydroxy ethylated alkyl phenol, tricresyl phosphate, triethyleneglycol diacetate, triethylene glycol caprate—caprylate, dioctyl phthalate and polyester plasticizers.

Representative examples of cores, which can be prepared according to the method described in Example 1, are:

45% Butyl acrylate
50% Butylene glycol acrylate
5% Allyl Methacrylate

70% Butyl acrylate
25% Butylene glycol acrylate
5% Allyl Methacrylate

20% Butyl acrylate
70% Butylene glycol acrylate
5% Allyl Methacrylate

90% Butyl acrylate
5% Butylene glycol acrylate
5% Allyl Methacrylate

70% Methyl methacrylate
25% Trimethylol Propane Triacrylate
5% Allyl Methacrylate 70% Styrene
25% Trimethylol Propane Triacrylate
5% Allyl Methacrylate 50% Styrene
50% Trimethylol Propane Triacrylate The core-shell polymers, as shown in Examples 5A to 5M, have excellent shelf stability, especially in the regions of core to shell ratios of 2:1 to 7:1 and greater than 9:1. They also provide very good self limiting characteristics regarding depth of photohardening, as exemplified in FIG. 3 by the plateau reached in the curve at higher levels of exposure. In contrast, the composition of Example 6, containing no core-shell polymer and no plasticizers has no self limiting properties regarding depth of photohardening in the exposure area examined, as shown by the straight line in FIG. 2.

A preferred core is a crosslinked polymer with a degree of crosslinking which renders the polymeric material nonswellable and insoluble in solvents for the noncrosslinked polymer material. Suitable crosslinked polymers are disclosed in Cohen et al. U.S. Pat. 4,414,278 incorporated by reference herein. This patent also provides a suitable disclosure concerning the meaning of crosslinking and swelling. Illustratively crosslinked "means a three-dimensional polymer network which is held together indissolubly by primary valence linkages which therefore is nonsoluble in solvents". Also this patent sets forth a suitable swelling test.

A preferred shell material has no pendant acid groups.

Examples of photohardenable compositions are given below for illustration purposes only, and should not be construed as restricting the scope or limits of this invention. All parts in the compositions are given by weight.

EXAMPLE 1

A core-shell polymer was prepared as follows:
Core
2388 gm of deionized water and 37.5 gm of a 30% aqueous solution of sodium dodecyl sulfonate were charged to a four-neck five liter flask equipped with a mechanical stirrer, condenser, heating mantle, addition funnel, thermometer and nitrogen inlet. The contents of the flask were purged with nitrogen, at room temperature, for 30 minutes and then heated up to 80° C. At that temperature, ⅛ of a monomer charge consisting of 1046 gm of butyl acrylate (BA), 279 gm of allyl methacrylate (AMA) and 70 gm of 1,4 butylene glycol diacrylate (BGD), was added in one shot. This was followed immediately by one shot additions of 19 ml of a 7% solution of sodium hydrogen phosphate, and 20 ml of a 5% solution of ammonium persulfate (both solutions were aqueous). The heat was turned off and the reaction mixture was allowed to exotherm. When the exotherm peaked at 84° C., the remainder of the monomer charge was added over a 90 minute period with intermittent heating to maintain the reaction temperature between 80° C. and 85° C. When the monomer (total monomer charge 1345 grams) addition was finished, the reaction mixture was heated at 80°–85° C. for an additional 2.5 hours. The final product was a bluish emulsion with 35.1% Solids and had a particle size of 0.097 micron. The ratio of the monomers in this case was BA/BGD/AMA=75/5/20.

[Shell]

2000 gm of the core emulsion, described above, was placed in a five liter flask equipped similarly to the one used for the core synthesis. The contents of the flask were purged with nitrogen, at room temperature, for 30 minutes. After the nitrogen purge, the flask was charged, with stirring, with a mixture consisting of 1.45 gm ammonium persulfate, 2.9 gm of a 30% aqueous solution of sodium dodecyl sulfonate, and 332 gm of deionized water, over a 30 minute period. The contents of the flask were then heated up to 85° C., and 179 gm of methyl methacrylate were added over 60 minutes. When all the monomer had been added, the reaction mixture was heated for an additional 2 hours. The final product was a bluish emulsion with 36.2% Solids and a particle size of 0.107 micron. The core to shell ratio was substantially 4:1.

The bluish emulsion was placed in a freezer for 3 days and then it was thawed, filtered, washed with deionized water, and dried at room temperature for about 3 days. For large samples, such as in the case of semiworks or plant batches, spray drying techniques involving hot air of 100° C. to 150° C. may be used.

EXAMPLE 2

| | 4A |
|---|---|
| Novacure 3704 (Bisphenol A bis(2-hydroxypropyl) diacrylate | 29.6 |
| TMPTA (Trimethylol Propane Triacrylate) | 29.6 |
| Plasthall 4141 (Triethylene glycol caprate - caprylate) | 14.8 |
| Triton X-100 (Octyl phenol poly ether alcohol) | 0.78 |
| Irgacure 651 2,2-dimethoxy-2 phenylacetophenone | 1.6 |
| Core-shell polymer with core:shell ratio 4:1 (Example 1) | 26.0 |

EXAMPLES 3A TO 3M

Core-shell polymers were made as in Example 1, with the difference that they had the following core compositions and core to shell ratios (the shell was methyl methacrylate):

| Sample | Core Composition* | | | | | | Core to Shell Ratio |
|---|---|---|---|---|---|---|---|
| | BA | MMA | S | BGD | TMPTA | AMA | |
| 3A | 70 | — | — | 25 | — | 5 | No shell |
| 3B | 70 | — | — | 25 | — | 5 | 4:1 |
| 3C | 70 | — | — | 25 | — | 5 | 8:1 |
| 3D | 70 | — | — | 25 | — | 5 | 16:1 |
| 3E | 45 | — | — | 50 | — | 5 | No shell |
| 3F | 45 | — | — | 50 | — | 5 | 8:1 |
| 3G | 45 | — | — | 50 | — | 5 | 16:1 |
| 3H | 90 | — | — | 5 | — | 5 | 16:1 |
| 3I | 25 | — | — | 70 | — | 5 | No shell |
| 3J | — | 45 | — | 50 | — | 5 | No shell |
| 3K | — | 70 | — | — | 25 | 5 | No shell |
| 3L | — | — | 70 | — | 25 | 5 | No shell |
| 3M | — | — | 50 | — | 50 | — | No shell |

*BA = Butyl acrylate
MMA = Methyl methacrylate
S = Styrene
BGD = Butylene Glycol Diacrylate
TMPTA = Trimethylol Propane Triacrylate
AMA = Allyl Methacrylate

EXAMPLES 4A TO 4M

Core-shell polymers having the compositions shown in Examples 3A to 3M were made by following the procedure described in Example 1.

EXAMPLES 5A TO 5M

Photohardenable compositions were made as in Example 2 by replacing the core-shell polymer of Example 1 with small amount of each of the core-shell polymers of Examples 4A to 4M to obtain comparable viscosity. These photohardenable compositions were placed in glass jars and they were examined periodically for settling characteristics. It was found that the compositions 4C and 4F started having some settling within one month, while the rest of the samples showed no signs of settling even after 5 months.

EXAMPLE 6

The following ingredients were mixed with a mechanical mixer until a homogeneous mixture was received:

| Novacure 3704 (Bisphenol A bis(2-hydroxypropyl) diacrylate | 50 |
|---|---|
| TMPTA (Trimethylol Propane Triacrylate) | 50 |
| Irgacure 651 (2,2-dimethoxy-2 phenylacetophenone) | 1.6 |

EXAMPLE 7

Part of the photohardenable composition described in Example 6 was poured into a stainless steel square cavity (1 ¾"×1 ¾"×110 mils thick). The excess liquid was removed by a doctor knife blade. The liquid was exposed with a rectangular pattern (1 9/16" × 1 ½") using an argon ion laser beam as described above.

After exposure, the solidified pattern was removed from the cavity with a pair of tweezers, and then blotted dry. The net weight and thickness of the pattern were measured and plotted against different exposure levels, as illustrated in FIG. 2.

EXAMPLE 8

Part of the photohardenable composition described in Example 2 was poured into a stainless steel square cavity (1 ¾"×1 ¾"×110 mils thick). The excess liquid was removed by a doctor knife blade. The liquid was exposed with a rectangular pattern (1 9/16" ×1 ½") using an argon ion laser beam as described above.

After exposure, the solidified pattern was removed from the cavity with a pair of tweezers, and then blotted dry. The net thickness of the pattern was measured and plotted against different exposure levels, as illustrated in FIG. 3.

EXAMPLE 9

The following ingredients were mixed with a mechanical mixer until a homogeneous mixture was received.

| | |
|---|---|
| Ethoxylated Trimethylol Propane Triacrylate | 14.75 |
| Plasthall 4141 (Triethylene glycol caprate - caprylate) | 22.13 |
| Novacure 3704 (Bisphenol A bis (2-hydroxypropyl) diacrylate | 36.88 |
| Triton X-100 (Octyl phenol polyether alcohol) | 0.68 |
| Irgacure 651 (2,2-dimethoxy-2-phenylacetophenone) | 1.56 |
| Core-shell polymer made as in Example 1 | 24.00 |

EXAMPLE 10

A three-dimensional object was made from 300 successive layers of the composition described in example 9, by using the method of this invention. An argon ion laser at 350–360 nm wavelength was utilized as the radiation source. The diameter of the laser beam was 5 thousands of one inch. Each layer had a thickness of 10 thousands of one inch.

What is claimed is:

1. A method for accurately fabricating an integral three-dimensional object from successive layers of a photohardenable liquid composition comprising the steps of:
   (a) forming a layer of a photohardenable liquid;
   (b) photohardening at least a portion of the layer of photohardenable liquid by exposure to actinic radiation;
   (c) introducing a new layer of photohardenable liquid onto the layer previously exposed to actinic radiation; and
   (d) photohardening at least a portion of the new liquid layer by exposure to actinic radiation, with the requirement that the photohardenable composition contains deflecting matter which comprises an ethylenically unsaturated monomer, a photoinitiator, and radiation deflecting matter comprising a polymer having a core formed from monomers comprising
   (i) a monofunctional ethylenically unsaturated monomer, constituting 5%–97% of the total core by weight;
   (ii) a multifunctional ethylenically unsaturated monomer or oligomer constituting 2%–70% of the total core by weight; and
   (iii) an ethylenically unsaturated monomer with a grafting site constituting 1%–25% of the total core by weight,
   wherein the deflecting matter has a first index of refraction, and the rest of the composition having a second index of refraction, the absolute value of the difference between the first index of refraction and the second index of refraction difference by at least 0.01.

2. The method of claim 1 wherein (ii) is present in a range from 4% to 70% and (iii) is present in a range from 5% to 25%.

3. The method of claim 2 wherein (ii) is present in a range from 4% to 6% and (iii) is present in a range from 15 to 25%.

4. The method of claim 2 wherein the deflecting matter comprises a core of said polymer and an outer shell.

5. The method of claim 1 wherein the outer shell is a polymer formed from at least one monofunctional monomer.

6. The method of claim 4 wherein the core shell weight ratio is 2:1 or greater.

7. The method of claim 6, wherein the core to shell weight ratio is within regions of 2:1 to 7:1 and greater than 9:1.

8. The method of claim 6, wherein steps (c) and (d) are successively repeated.

9. The method of claim 1, wherein the composition also comprises a plasticizer.

10. The method of claim 1, wherein the actinic radiation is in the form of a beam.

11. The method of claim 4 wherein the core is crosslinked polymer which is nonswellable and insoluble in a solvent for noncrosslinked polymer material.

12. The method of claim 4 wherein the core contains no pendant acid groups.

13. The method of claim 1 wherein the core contains no pendant acid groups.

14. An article made by the method of claim 13.

* * * * *